United States Patent
Shing et al.

(10) Patent No.: US 10,095,115 B2
(45) Date of Patent: Oct. 9, 2018

(54) FORMING EDGE ETCH PROTECTION USING DUAL LAYER OF POSITIVE-NEGATIVE TONE RESISTS

(71) Applicant: GLOBALFOUNDRIES INC., Grand Cayman (KY)

(72) Inventors: Christopher B. Shing, Fishkill, NY (US); Joyce C. Liu, Carmel, NY (US); Richard D. Kaplan, Wappingers Falls, NY (US); Timothy J. Wiltshire, Fishkill, NY (US); Darius Brown, Latham, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 57 days.

(21) Appl. No.: 15/255,237

(22) Filed: Sep. 2, 2016

(65) Prior Publication Data
US 2018/0067396 A1    Mar. 8, 2018

(51) Int. Cl.
G03F 7/20    (2006.01)
G03F 7/40    (2006.01)
G03F 7/32    (2006.01)

(52) U.S. Cl.
CPC .............. *G03F 7/2028* (2013.01); *G03F 7/32* (2013.01); *G03F 7/40* (2013.01)

(58) Field of Classification Search
CPC ......... G03F 7/0035; G03F 7/20; G03F 7/2022
See application file for complete search history.

(56) References Cited

U.S. PATENT DOCUMENTS

| | | |
|---|---|---|
| 4,578,344 A | 3/1986 | Griffing et al. |
| 5,877,076 A | 3/1999 | Dai |
| 6,713,236 B2 | 3/2004 | Chen |
| 2014/0239454 A1 | 8/2014 | Cai et al. |
| 2015/0001682 A1 | 1/2015 | Liu et al. |
| 2015/0212420 A1* | 7/2015 | Chang ................. H01L 21/3085 438/703 |
| 2017/0053891 A1* | 2/2017 | Rubin ..................... H01L 24/83 |

OTHER PUBLICATIONS

Igor Jekauc et al., "Necessity of Chemical Edge Bead Removal in Modern Day Lithographic Processing", Advances in Resist Technology and Processing XXI, Proc. of SPIE vol. 5376, 2004, pp. 1255-1263.

* cited by examiner

*Primary Examiner* — Kathleen Duda
(74) *Attorney, Agent, or Firm* — Gibb & Riley, LLC; Yuanmin Cai

(57) ABSTRACT

Methods of forming edge etch protection using dual layers of positive-negative tone resists. According to a method, a wafer substrate is provided. A first type resist is deposited on a surface of the wafer substrate. The first type resist is patterned and a resist ring is created around a peripheral edge of the wafer substrate. The resist ring is cured. A second type resist is deposited on the surface of the wafer substrate and the resist ring. The second type resist is different from the first type resist.

15 Claims, 9 Drawing Sheets

FORMING EDGE ETCH PROTECTION USING DUAL LAYER OF POSITIVE-NEGATIVE TONE RESISTS

BACKGROUND

The present disclosure relates to semiconductor device fabrication and more particularly, to protection of the wafer edge during processing of the wafer.

Photolithography is a commonly used technique in the manufacture of semiconductor devices. The process uses patterns to define regions on a substrate. More specifically, with photolithography, a photoresist layer may be formed on a substrate, such as a silicon wafer, and then the resist layer is covered with a mask containing a pattern. The mask is exposed to radiation, such as ultraviolet light (UV), which is transmitted through transparent areas of the mask to cause a chemical reaction in corresponding regions of the photoresist. In other words, in the course of processing integrated circuits and the like in semiconductor devices, a standard sequence may involve putting down a layer of material, depositing a layer of photoresist on the layer of material, patterning the photoresist by projecting a pattern on it, and developing the resist to produce a pattern of open areas that expose the material, with the other areas of the material still covered by the resist.

In addition, other etching and cleaning techniques may be used to create integrated circuit dies. During certain etching processes the edge of the wafer may need protection in order to avoid the formation of edge related defects (e.g., blistering, cracks formed from incomplete patterns) and to increase yielding die from the wafer.

SUMMARY

Devices and methods described herein increase the number of available yielding die near the wafer's edge compared to current standard practice, which may skip edge exposure completely to avoid the formation of edge related defects due to incomplete patterns. On a first pass, a thick layer of a negative tone resist is deposited on a substrate, an edge portion of the thick layer is exposed to light via an optical edge bead removal (EBR) process, and developed to form the edge protective resist layer. On a second pass, a high temperature dehydration/curing bake is performed, followed by standard processing of a thick layer of positive tone resist. After exposure and development, a patterned wafer with edge protection is formed.

According to a method, a wafer substrate is provided. A first type resist is deposited on a surface of the wafer substrate. The first type resist is patterned and a resist ring is created around a peripheral edge of the wafer substrate. The resist ring is cured. A second type resist is deposited on the surface of the wafer substrate and the resist ring. The second type resist is different from the first type resist.

According to another method, a layer of a negative tone resist is deposited on a substrate. The negative tone resist is exposed, and the negative tone resist is developed to form an edge protective resist layer. A curing process is performed on the edge protective resist layer. After the curing process, a layer of a positive tone resist is deposited on the substrate.

According to another method, a substrate is provided. A layer of a first type resist is deposited on the substrate. The first type resist is exposed around a peripheral edge of the substrate forming an edge protective resist layer. The first type resist is developed to remove a center portion of the first type resist. A curing process is performed on the edge protective resist layer. After the curing process, a layer of a second type resist is deposited on the substrate. The second type resist is different from the first type resist. The second type resist is patterned. The pattern is transferred into the substrate, wherein the edge protective resist layer of the first type resist protects the edge portion of the substrate from being patterned.

BRIEF DESCRIPTION OF THE DRAWINGS

The devices and methods herein will be better understood from the following detailed description with reference to the drawings, which are not necessarily drawn to scale and in which.

DETAILED DESCRIPTION

Figure 1:
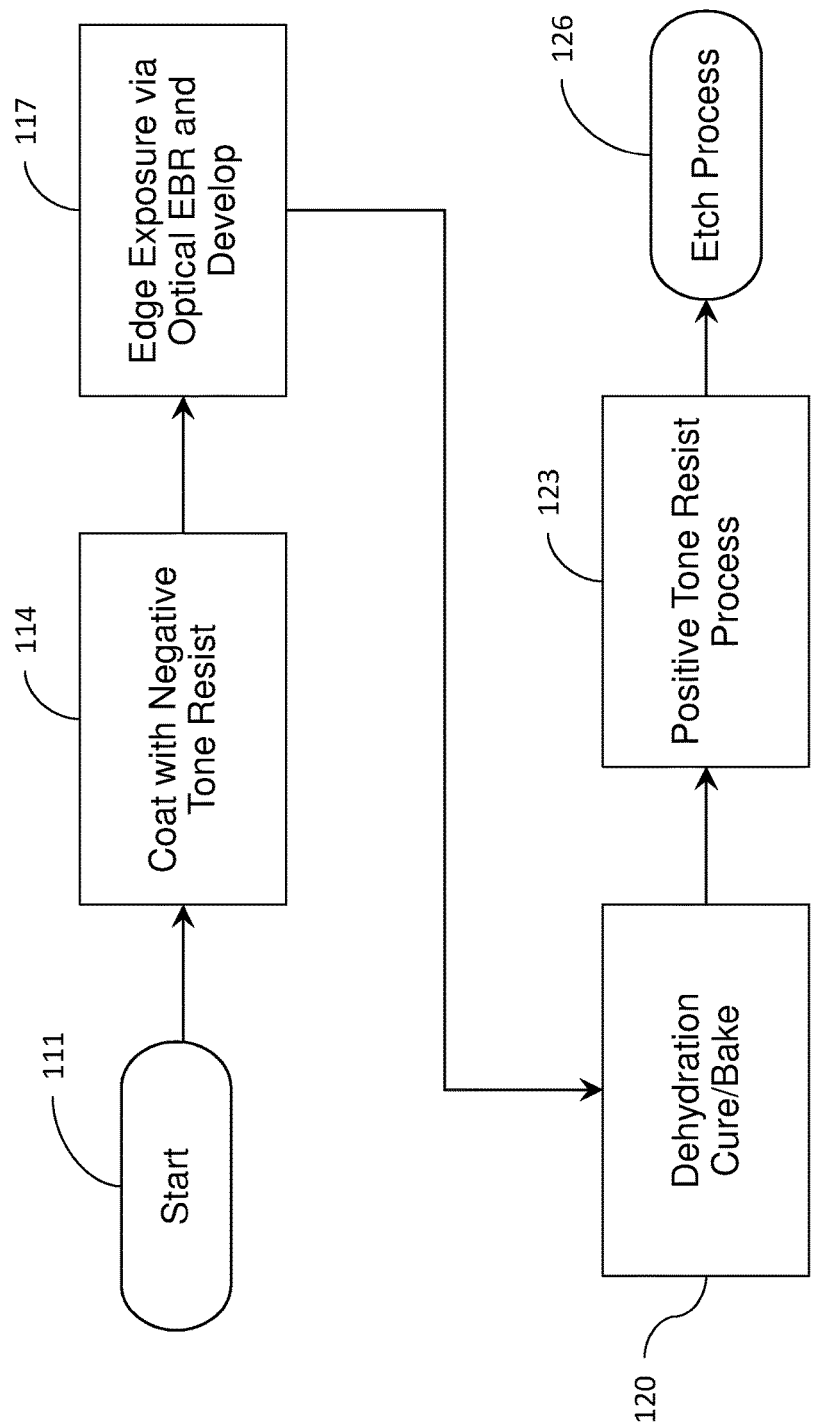
FIG. 1 is an illustration of the process flow according to devices and methods herein.

The disclosure will now be described with reference to a process for protection of the wafer edge during processing of a semiconductor wafer. While the disclosure will be described hereinafter in connection with specific devices and methods thereof, it will be understood that limiting the disclosure to such specific devices and methods is not intended. On the contrary, it is intended to cover all alternatives, modifications, and equivalents as may be included within the spirit and scope of the disclosure as defined by the appended claims.

For a general understanding of the features of the disclosure, reference is made to the drawings. In the drawings, like reference numerals have been used throughout to identify identical elements.

Semiconductor device fabrication is typically a multiple step sequence of photolithographic and chemical processing steps during which electronic circuits are gradually created on a wafer made of semiconducting material. Etching may be used to remove layers from the surface of a wafer and to form trenches in the wafer during manufacturing. Etching, in conjunction with lithographic techniques, may be used to attack certain areas of a semiconductor surface in order to form recesses in the material or to otherwise remove portions of semiconductor layers where predominantly vertical sides are desired. For many etching steps, part of the wafer is protected from the etchant by a masking material that resists etching.

For electronic applications, semiconducting substrates, such as silicon wafers, can be used. The substrate enables easy handling of the micro device through the many fabrication steps. Often many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many other steps performed. The complexity of microfabrication processes can be described by their mask count.

Optical lithography typically uses ultraviolet light against a photoresist. A photoresist is a light-sensitive material used to selectively expose a layer of material on a substrate. There are two types of photoresists. Positive photoresist, the most common type, becomes soluble in the basic developer when exposed; negative photoresist becomes insoluble in the developer. This chemical change allows some of the photoresist to be removed by a special solution, called "developer" by analogy with photographic developer. In other words, a positive resist is a type of photoresist in which the portion of the photoresist that is exposed to light becomes soluble to the photoresist developer. The portion of the photoresist that is unexposed remains insoluble to the photoresist developer. A negative resist is a type of photoresist in which the portion of the photoresist that is exposed to light becomes insoluble to the photoresist developer. The unexposed portion of the photoresist is dissolved by the photoresist developer.

Now, referring to the drawings, FIG. 1 shows an overview of the process flow for forming edge etch protection of a wafer using dual layers of positive-negative tone resists according to devices and methods herein. The process starts at 111 with a first pass. On the first pass, a layer of a negative tone resist is deposited on a substrate, as indicated at 114. Then, at 117, resist along an edge of the substrate is exposed via optical EBR to create an exposed resist ring approximately 3 mm wide. In addition, as indicated at 117, a developer is applied to the negative tone resist to form the edge protective resist layer. On a second pass, a heating process, such as a high temperature bake, is performed on the substrate to dehydrate/cure the edge protective resist layer, as indicated at 120. The heating process is followed by depositing a layer of positive tone resist and processing of the positive tone resist, as indicated at 123. After exposure and development, a patterned wafer with edge protection is formed. Etch processing of the wafer proceeds, as indicated at 126.

Figure 2:
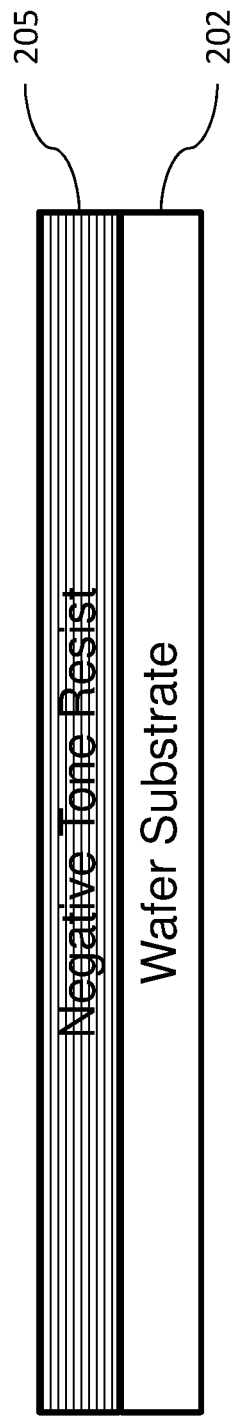
FIG. 2 shows a portion or a wafer illustrating manufacturing steps according to devices and methods herein.
Figure 3:
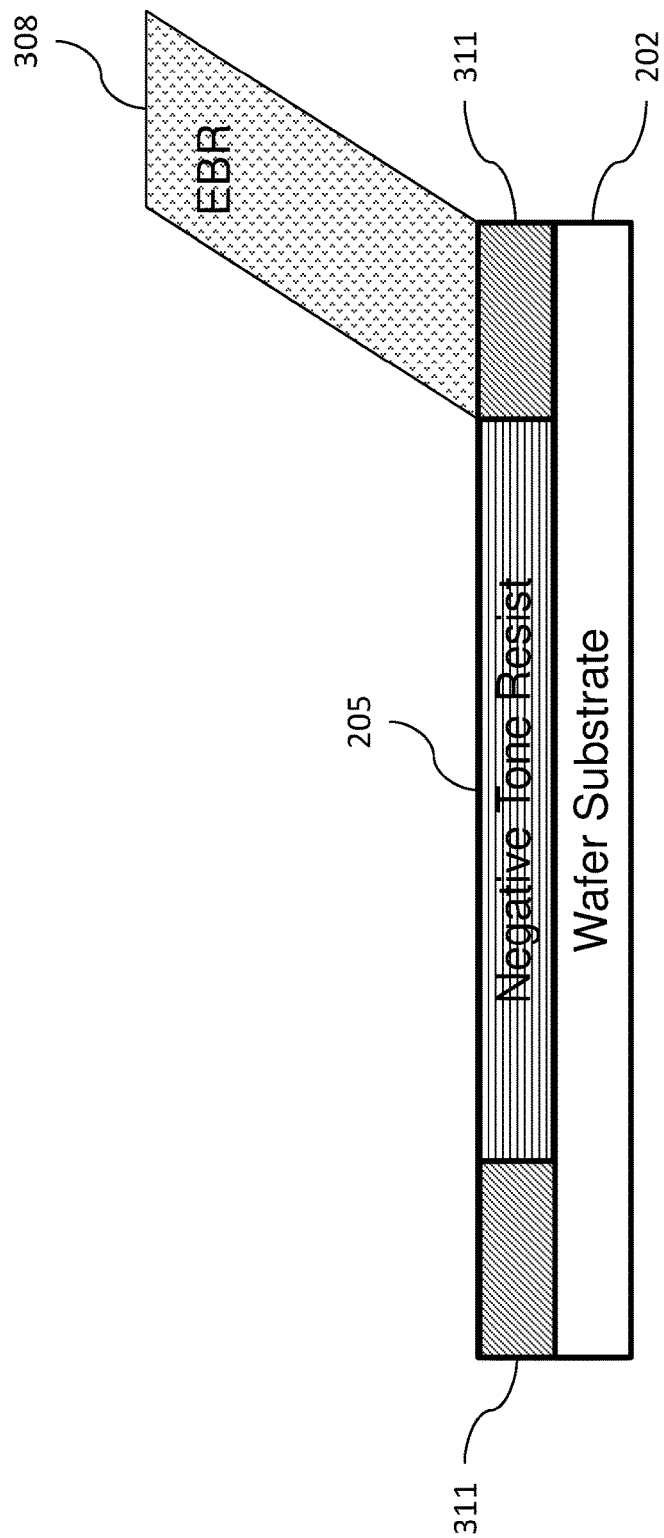
FIG. 3 shows a portion or a wafer illustrating manufacturing steps according to devices and methods herein.

FIGS. 2-8 illustrate the wafer structure through the various manufacturing steps according to embodiments of methods herein. FIG. 2 shows the deposition of a first type resist. As shown in FIG. 2, a wafer substrate 202 is provided. On the first pass, a layer of a first type resist 205 is deposited on the wafer substrate 202. According to devices and methods herein, the first type resist may be a negative tone resist. FIG. 3 shows exposure of the edge portion of the first type resist to light. As illustrated, the exposure may be via an optical edge bead removal (EBR) process, indicated at 308, according to one embodiment of the present invention. Those skilled in the art will recognize that, during a conventional optical edge bead removal (EBR), the edge portion of a wafer is exposed to short wavelength light to selectively remove a bead of material that forms around the edge of the wafer following material deposition. In the present methods, this same exposure process can be used to expose the edge portion of a negative tone resist and, thereby pattern the negative tone resist. According to devices and methods herein, the optical EBR process 308 creates a resist ring 311.

Figure 4:
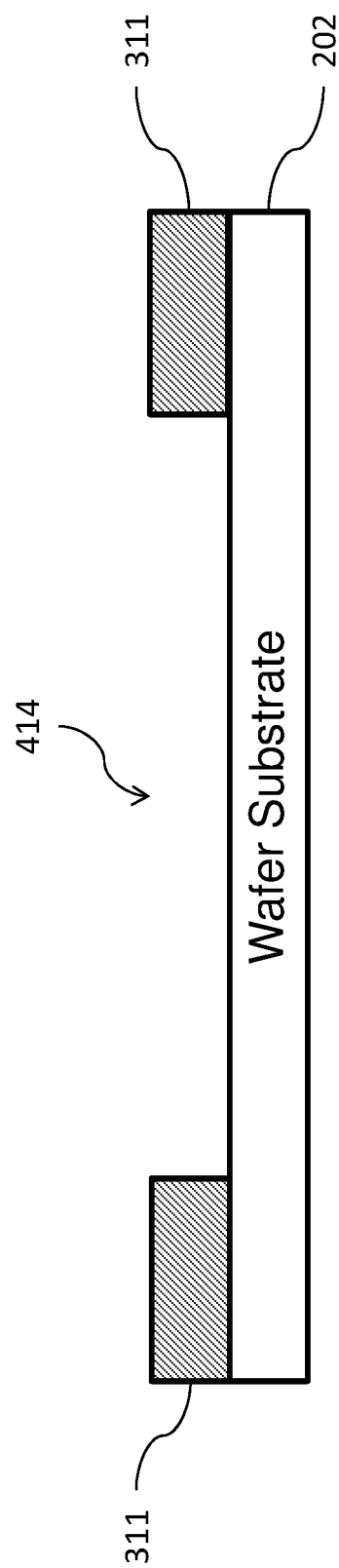
FIG. 4 shows a portion or a wafer illustrating manufacturing steps according to devices and methods herein.

FIG. 4 shows development of the first type resist. The unexposed region 414 is washed away by a developer solution. In other words, after the exposure, the unexposed portion of the first type resist 205 is no longer needed, so it may be removed from the wafer substrate 202 by an appropriate stripping process. This usually requires a liquid "resist stripper" that chemically alters the resist so that it no longer adheres to the substrate.

Figure 5:
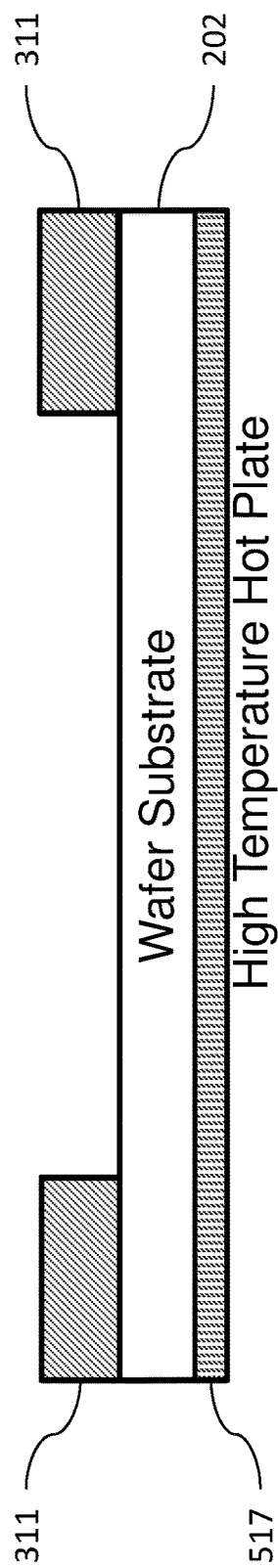
FIG. 5 shows a portion or a wafer illustrating manufacturing steps according to devices and methods herein.
Figure 6:
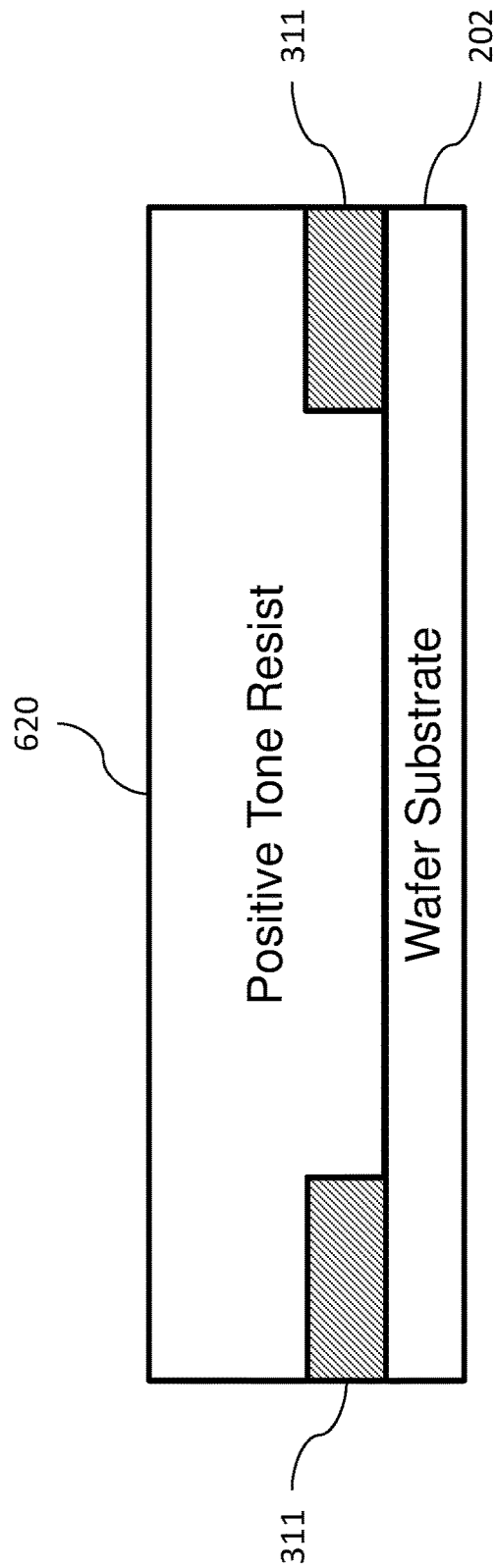
FIG. 6 shows a portion or a wafer illustrating manufacturing steps according to devices and methods herein.
Figure 7:
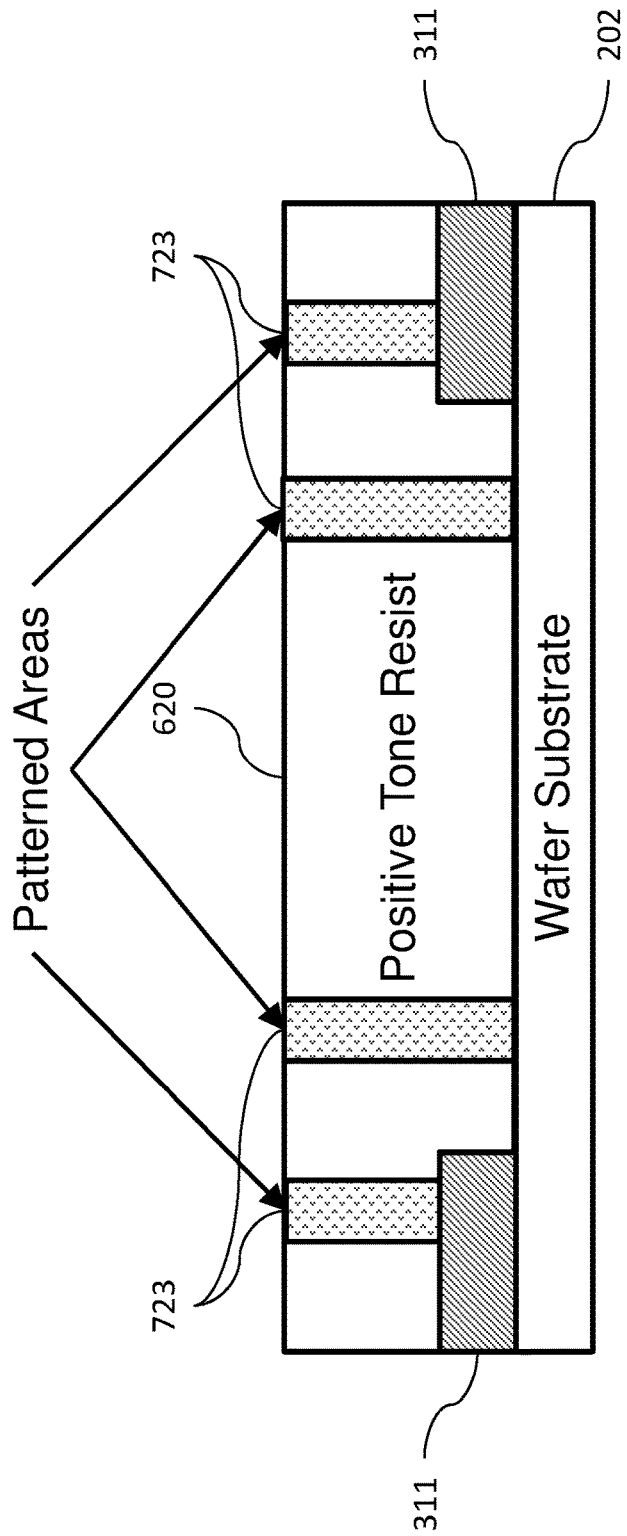
FIG. 7 shows a portion or a wafer illustrating manufacturing steps according to devices and methods herein.
Figure 8:
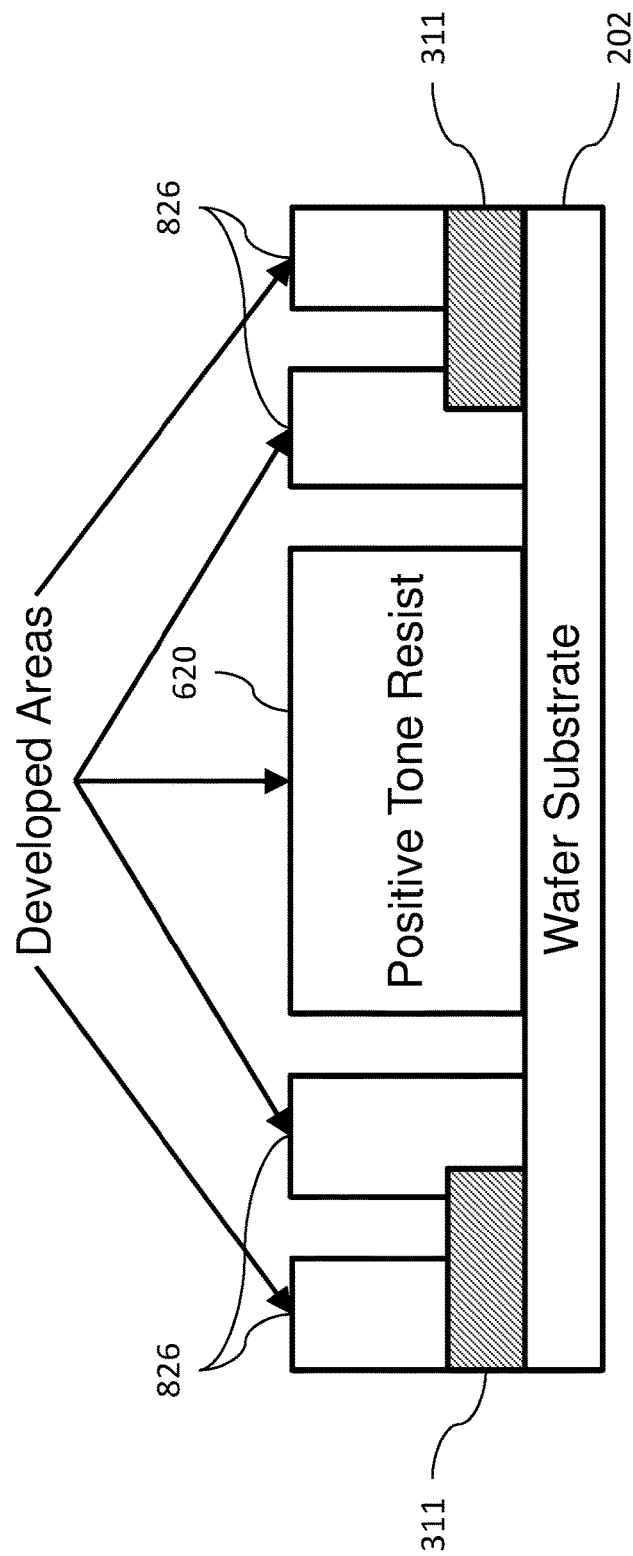
FIG. 8 shows a portion or a wafer illustrating manufacturing steps according to devices and methods herein.

On the second pass, a process to dehydrate and cure the resist ring 311 is performed. As shown in FIG. 5, as a non-limiting example, a high temperature hot plate 517 or similar device can be used to bake the wafer in order to cure the resist ring 311. FIG. 6 shows the deposition of a second type resist. As shown in FIG. 6, after the bake process, a layer of a second type resist 620 is deposited on the wafer substrate 202 and the resist ring 311. According to devices and methods herein, the second type resist may be a positive tone resist. FIG. 7 shows pattern exposure of the second type resist. Patterning may be performed on the second type resist 620 to isolate the active parts of a semiconductor device, such as a transistor, and the like. Patterning covers the series of processes that shape or alter the existing shape of the deposited materials. As shown in FIG. 7, one or more areas 723 may be patterned on the second type resist 620 for subsequent removal. FIG. 8 shows developing of the second type resist. As shown in FIG. 8, the developing removes the exposed portions of the second type resist 620 and the patterned portions, such as patterned areas 723 are removed. Further etching, patterning, and processing of the wafer substrate 202 can continue, as would be known to one of ordinary skill in the art.

Figure 9:
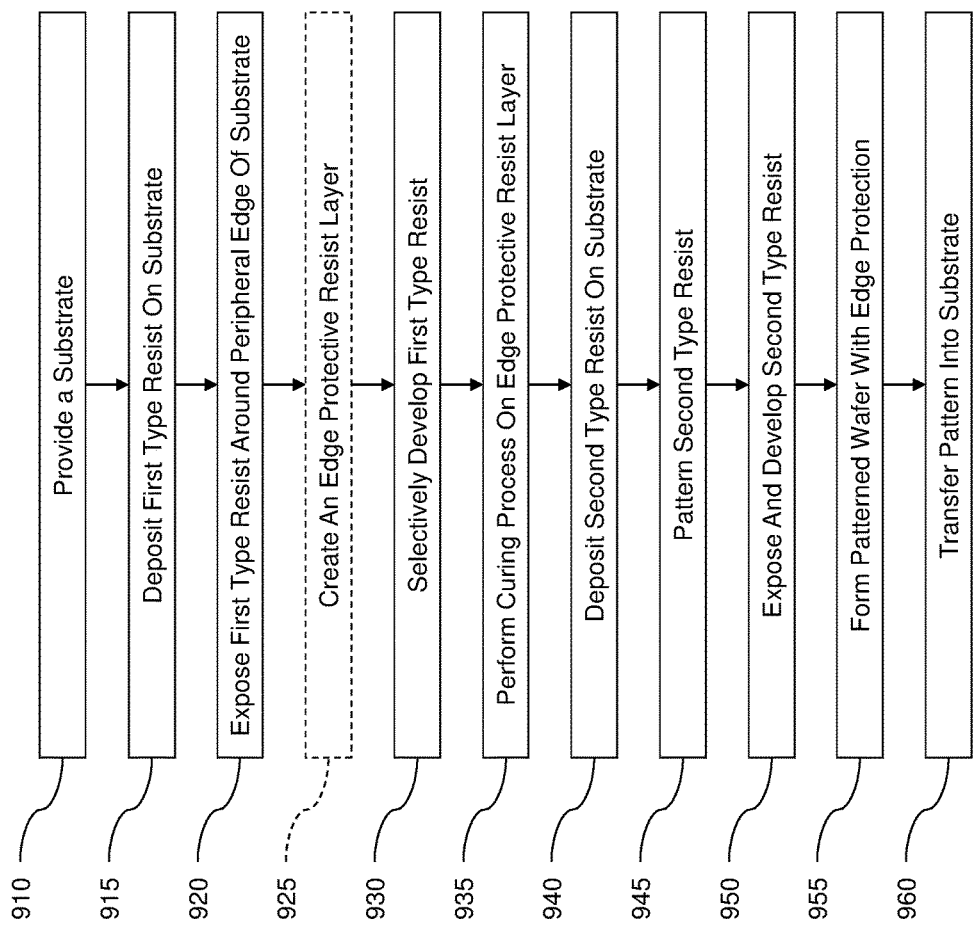
FIG. 9 is a flow diagram according to devices and methods herein.

FIG. 9 is a flow diagram illustrating the processing flow of an exemplary method of forming edge etch protection using dual layer of positive-negative tone resists according to devices and methods herein. In item 910, a substrate is provided. On a first pass, a layer of a first type resist is deposited on the substrate, at 915. The first type resist may be a negative tone resist. The first type resist is exposed around a peripheral edge of the substrate, at 920. In particular, the edge of the substrate may be exposed via optical EBR. The optical exposure of the first type resist creates an edge protective resist layer, as indicated at 925. The edge protective resist layer is sometimes referred to as a resist ring. At 930, the first type resist is developed to remove a remaining center portion of the first type resist. On a second pass, a curing process is performed on the edge protective resist layer by heating the substrate, at 935. That is, a high temperature bake may be performed on the substrate to dehydrate/cure the edge protective resist layer. After the curing process, a layer of a second type resist is deposited on the substrate, at 940. The second type resist is different from the first type resist. In other words, the second type resist may be a positive tone resist while the first type resist may be a negative tone resist. At 945, the second type resist is patterned. The second type resist is exposed and developed, at 950. A patterned wafer with edge protection is formed, at 955. The pattern is transferred into the substrate, at 960, wherein the edge protective resist layer of the first type resist protects the edge portion of the substrate from being patterned.

After the pattern is transferred into the substrate, at 960, the resist can be removed. Optionally, if selective etch is used and additional patterning of the substrate is required, the second type resist can be removed and an additional second type resist can be deposited over the substrate and the resist ring. The additional second type resist can be patterned with an additional pattern (e.g., in the same manner as discussed above) and the additional pattern can be transferred into the substrate. During this additional patterning process, the resist ring remains intact so as to continue to provide edge protection. After the first type resist is no longer needed, it may be removed from the wafer substrate.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

The methods as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular examples of the disclosed methods and is not intended to be limiting of this disclosure. For example, as used herein, the singular forms "a", "an", and "the" are intended to include the plural forms as well, unless the context clearly indicates otherwise. Additionally, as used herein, the terms "comprises," "comprising," "includes", and/or "including," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various devices and methods of the present disclosure have been presented for purposes of illustration, but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein.

While various examples are described herein, it will be appreciated from the specification that various combinations of elements, variations, or improvements therein may be made by those skilled in the art, and are within the scope of the disclosure. In addition, many modifications may be made to adapt a particular situation or material to the teachings of the disclosed concepts without departing from the essential scope thereof. Therefore, it is intended that the concepts not be limited to the particular examples disclosed as the best mode contemplated for carrying out the devices and methods herein, but that the devices and methods will include all features falling within the scope of the appended claims.

What is claimed is:

1. A method, comprising:
    providing a wafer substrate;
    depositing a negative tone resist on a surface of the wafer substrate;
    exposing to light a portion of the negative tone resist, the portion being at a peripheral edge of the wafer substrate, wherein exposing the portion of the negative tone resist comprises applying an optical edge bead removal (EBR) process in the exposing;
    after exposing the portion of the negative tone resist to light, developing the negative tone resist to create a resist ring around the peripheral edge of the wafer substrate;
    curing the resist ring; and
    depositing a positive tone resist on the surface of the wafer substrate and the resist ring.

2. The method according to claim 1,
    wherein developing the negative tone resist removes an un-exposed center portion of the negative tone resist.

3. The method according to claim 1, wherein the curing comprises performing a heating process to cure and dehydrate the negative tone resist around the peripheral edge of the wafer substrate.

4. The method according to claim 1, further comprising:
    patterning the positive tone resist.

5. A method comprising:
    depositing a layer of a negative tone resist on a substrate;
    exposing to light a portion of the negative tone resist at a peripheral edge of the substrate, and developing the negative tone resist to form an edge protective resist layer, wherein exposing the portion of the negative tone resist comprises applying an optical edge bead removal (EBR) process in the exposing;
    performing a curing process on the edge protective resist layer; and
    after the curing process, depositing a layer of a positive tone resist on the substrate.

6. The method according to claim 5, wherein exposing a portion of the negative tone resist forms a resist ring around a peripheral edge of the substrate.

7. The method according to claim 6, further comprising:
developing the negative tone resist to remove a center portion of the negative tone resist.

8. The method according to claim 5, wherein the curing process comprises heating the substrate to cure and dehydrate the negative tone resist around the peripheral edge of the substrate.

9. The method according to claim 5, further comprising: patterning the positive tone resist.

10. The method according to claim 9, wherein patterning the positive tone resist comprises:
exposing and developing the positive tone resist.

11. The method according to claim 9, wherein the edge protective resist layer of the negative tone resist protects the peripheral edge of the substrate from being patterned.

12. A method, comprising:
providing a substrate;
depositing a layer of a negative tone resist on the substrate;
exposing to light the negative tone resist around a peripheral edge of the substrate forming an edge protective resist layer, wherein exposing the negative tone resist comprises applying an optical edge bead removal (EBR) process in the exposing;
developing the negative tone resist to remove a center portion of the negative tone resist;
performing a curing process on the edge protective resist layer;
after the curing process, depositing a layer of a positive tone resist on the substrate;
patterning the positive tone resist; and
transferring the pattern into the substrate, wherein the edge protective resist layer of the negative tone resist protects the peripheral edge of the substrate from being patterned.

13. The method according to claim 12, wherein the edge bead removal process forms a resist ring around the peripheral edge of the substrate.

14. The method according to claim 12, wherein the curing process comprises heating the substrate to cure and dehydrate the negative tone resist around the peripheral edge of the substrate.

15. The method according to claim 12, wherein patterning the positive tone resist comprises exposing and developing the positive tone resist.

* * * * *